US008830552B2

(12) United States Patent
Hirayama et al.

(10) Patent No.: US 8,830,552 B2
(45) Date of Patent: Sep. 9, 2014

(54) OPTICAL MODULATION DEVICE

(75) Inventors: Masahiro Hirayama, Kanagawa (JP); Tsutomu Abe, Kanagawa (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 283 days.

(21) Appl. No.: 13/540,928

(22) Filed: Jul. 3, 2012

(65) Prior Publication Data

US 2013/0010343 A1     Jan. 10, 2013

(30) Foreign Application Priority Data

Jul. 4, 2011    (JP) .................................. 2011-148300

(51) Int. Cl.
| | |
|---|---|
| *G02F 1/01* | (2006.01) |
| *G02B 6/12* | (2006.01) |
| *H03H 7/38* | (2006.01) |
| *H01S 5/026* | (2006.01) |
| *G02B 6/42* | (2006.01) |
| *H01P 5/02* | (2006.01) |

(52) U.S. Cl.
CPC ............ *G02F 1/0121* (2013.01); *H01S 5/0265* (2013.01); *G02B 6/423* (2013.01); *H01S 5/026* (2013.01); *H01P 5/02* (2013.01); *G02B 6/4246* (2013.01); *G02F 1/011* (2013.01)
USPC ................ 359/238; 398/182; 385/14; 333/33

(58) Field of Classification Search
CPC ....... G02F 1/01; G02F 1/0121; G02F 1/0344; G02F 1/01708; G02B 6/423; G02B 6/4246; H01P 5/02; H01S 5/0265; H01S 5/026
USPC .................. 398/182, 201; 385/14, 17, 24, 49; 359/238; 333/33, 34, 35, 248, 263
See application file for complete search history.

(56) References Cited

U.S. PATENT DOCUMENTS

| | | | | |
|---|---|---|---|---|
| 6,101,295 | A * | 8/2000 | Mineo et al. ....................... 385/1 |
| 6,677,830 | B2 * | 1/2004 | Miller et al. ..................... 333/33 |
| 6,735,353 | B2 * | 5/2004 | Hirata et al. .................... 385/14 |
| 6,941,080 | B2 * | 9/2005 | Kasper et al. ................. 398/186 |
| 7,031,558 | B2 * | 4/2006 | Tanbakuchi ....................... 385/1 |
| 7,512,295 | B2 * | 3/2009 | Welch et al. .................... 385/14 |
| 8,218,973 | B2 * | 7/2012 | Kagaya et al. ................ 398/182 |

FOREIGN PATENT DOCUMENTS

JP       2005-252251 A    9/2005

* cited by examiner

*Primary Examiner* — David N Spector
(74) *Attorney, Agent, or Firm* — Westerman, Hattori, Daniels & Adrian, LLP (57) ABSTRACT

An optical modulation device includes: an optical modulator; an insulating layer; an RC circuit including a resistor and a capacitor connected in series; a bonding wire connected between the optical modulator and the RC circuit; a first metal layer provided on the insulating layer; and a second metal layer that has a width larger than that of the first metal layer and is provided on the insulating layer, the second metal layer being connected with a ground potential and being connected to the RC circuit via the first metal layer.

16 Claims, 10 Drawing Sheets

OPTICAL MODULATION DEVICE

CROSS-REFERENCE TO RELATED APPLICATION

This application is based upon and claims the benefit of priority of the prior Japanese Patent Application No. 2011-148300, filed on Jul. 4, 2011, the entire contents of which are incorporated herein by reference.

BACKGROUND (i) Technical Field

The present invention relates to an optical modulation device, in particular, relates to an optical modulation device having a matching circuit.

(ii) Related Art

An optical modulator modulating a transmitted light is used for an optical module or the like for high speed optical communication. The optical modulator modulates intensity of an optical signal according to an input electrical signal. For example, Japanese Patent Application Publication No. 2005-252251 discloses an optical module having an EA (Electro-Absorption) optical modulator.

SUMMARY

It is an object to provide an optical modulation device achieving stable characteristics.

According to an aspect of the present invention, there is provided an optical modulation device comprising: an optical modulator; an insulating layer; an RC circuit including a resistor and a capacitor connected in series; a bonding wire connected between the optical modulator and the RC circuit; a first metal layer provided on the insulating layer; and a second metal layer that has a width larger than that of the first metal layer and is provided on the insulating layer, the second metal layer being connected with a ground potential and being connected to the RC circuit via the first metal layer.

DETAILED DESCRIPTION

An electrode of an optical modulator to which a signal is input is terminated with predetermined impedance with use of a matching circuit. The matching circuit includes a bonding wire. An impedance-matching condition fluctuates according to a length of the bonding wire. Therefore, when there is a length difference between bonding wires during a manufacturing process of an optical modulation device, the impedance fluctuates. Therefore, desirable characteristics of the optical modulation device are not achieved.

Figure 1A:
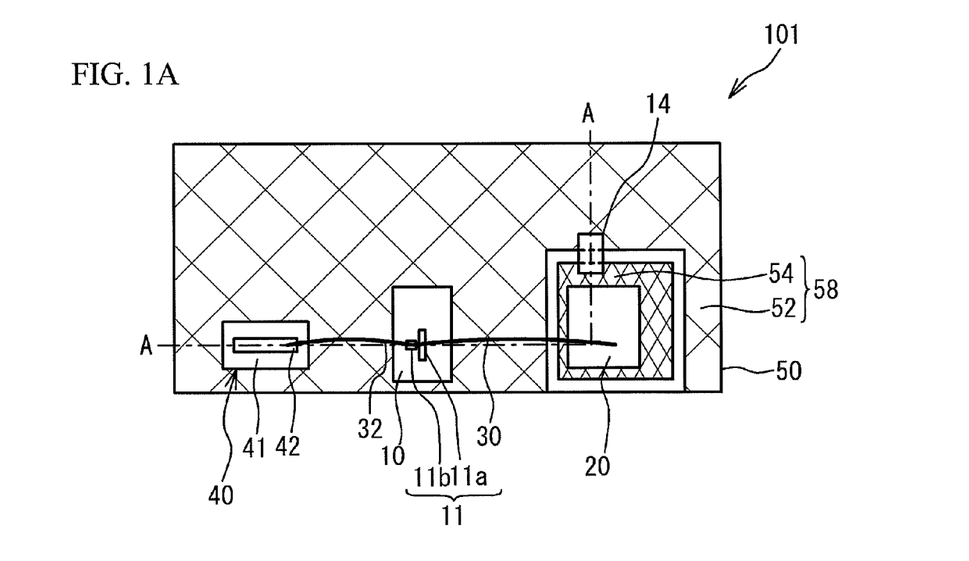
FIG. 1A illustrates a top view of an optical modulation device.
Figure 1B:
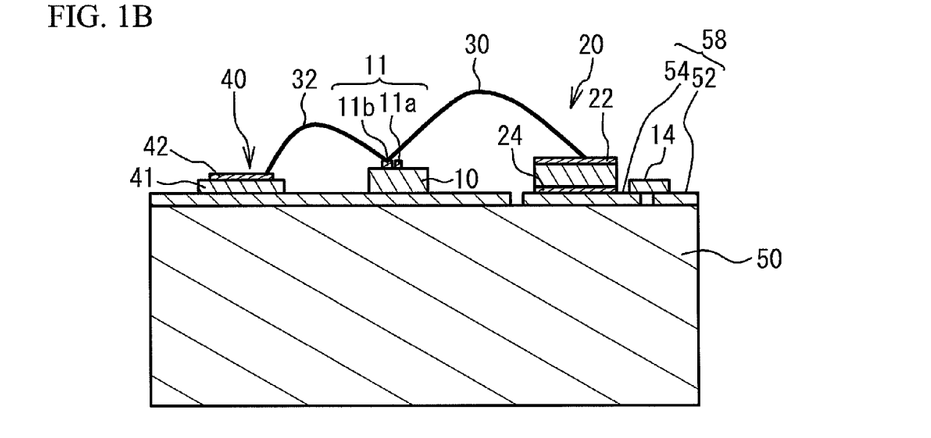
FIG. 1B illustrates a schematic cross sectional view taken along a line A-A of FIG. 1A.

First, a description will be given of an optical modulation device 101 in accordance with a comparative example. FIG. 1A illustrates a top view of the optical modulation device 101. FIG. 1B illustrates a schematic cross sectional view taken along a line A-A of FIG. 1A. As illustrated in FIG. 1A and FIG. 1B, the optical modulation device 101 has a structure in which a metal layer 58 composed of Au, Cu or the like is provided on an upper face of a dielectric substrate 50 composed of aluminum oxide, ceramics or the like. The metal layer 58 includes a metal layer 52 and a metal layer 54. The metal layer 52 is electrically insulated from the metal layer 54. The metal layer 52 is connected with a constant potential such as a ground potential. A dielectric substrate 41 and an optical modulator 10 are provided on the metal layer 52. The dielectric substrate 41 is composed of aluminum oxide, ceramics or the like. A lower face of the dielectric substrate 41 is contact to the metal layer 52. A wiring pattern 42 composed of a metal layer such as Au or Cu is provided on an upper face of the dielectric substrate 41. The wiring pattern 42 and the metal layer 52 form a micro strip line as a distributed line 40 (transmission line).

The distributed line 40 transmits an input signal to the optical modulator 10. The optical modulator 10 has an electrode 11, to which the input signal is input, on an upper face thereof. The electrode 11 has a stripe-shaped electrode 11a and a pad electrode 11b coupled to the stripe-shaped electrode 11a. A first end of a bonding wire 32 is jointed to the pad electrode 11b. A second end of the bonding wire 32 is jointed to an edge of the distributed line 40. Thus, the edge of the distributed line 40 is electrically coupled to the electrode 11. The optical modulator 10 is, for example, an EA modulator, and modulates an output signal according to the input signal.

A chip capacitor 20 is provided on the metal layer 54. An electrode 22 is provided on an upper face of the chip capacitor 20, and an electrode 24 is provided on a lower face of the chip capacitor 20. The electrode 24 on the lower face of the chip capacitor 20 is provided on the metal layer 54 so as to be electrically coupled to the metal layer 54. A first end of a bonding wire 30 is jointed to the pad electrode 11b. A second end of the bonding wire 30 is jointed to the electrode 22 on the upper face of the chip capacitor 20. Thus, the electrode 11 is electrically coupled to the electrode 22 of the chip capacitor 20. A first end of a resistor element 14 is electrically coupled to the metal layer 54. A second end of the resistor element 14 is electrically coupled to the metal layer 52. The bonding wires 30 and 32 are composed of a metal such as Au.

Figure 2:
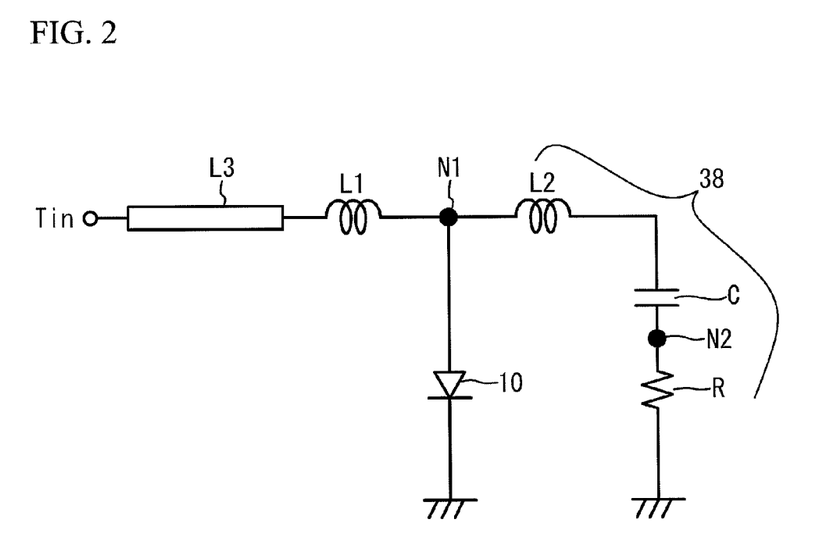
FIG. 2 illustrates a circuit diagram of the optical modulation device in accordance with the comparative example.

FIG. 2 illustrates a circuit diagram of the optical modulation device in accordance with the comparative example. As illustrated in FIG. 2, an inputting terminal Tin is electrically coupled to a node N1 via a distributed line L3 and an inductor L1. The distributed line L3 corresponds to the distributed line 40. The inductor L1 corresponds to the bonding wire 32. The bonding wire (inductor L1) acts as a connecting element connected between the transmission line (the distributed line 40 or the inductor L3) and the optical modulator 10. The node N1 corresponds to the electrode 11. An anode of the optical modulator 10 is coupled to the node N1. A cathode of the optical modulator 10 is grounded via the metal layer 52. The node N1 is grounded via an inductor L2, a capacitor C, a node N2 and a resistor R in series. The inductor L2 corresponds to the bonding wire 30. The capacitor C corresponds to the chip capacitor 20. The node N2 corresponds to the metal layer 54. The resistor R corresponds to the resistor element 14.

The inductor L2, the capacitor C and the resistor R form an impedance-matching circuit 38. The impedance-matching circuit 38 matches termination impedance of the optical modulator 10 to 50Ω. In this case, a resistance value of the resistor R is set to be 50Ω that is the same as the termination impedance.

In the comparative example, an inductance component of the impedance-matching circuit 38 fluctuates according to a length variability of the bonding wire 30. Thus, the impedance-matching condition fluctuates. For example, an input signal is modulated into a signal at a few tens of GHz, in an optical modulator used for an optical communication of 10 Gbs or 40 Gps. Therefore, the length variability of the bonding wire 30 has large influence on the inductance component. In this case, the optical modulator 10 is not capable of achieving stable characteristics.

First Embodiment

Figure 3A:
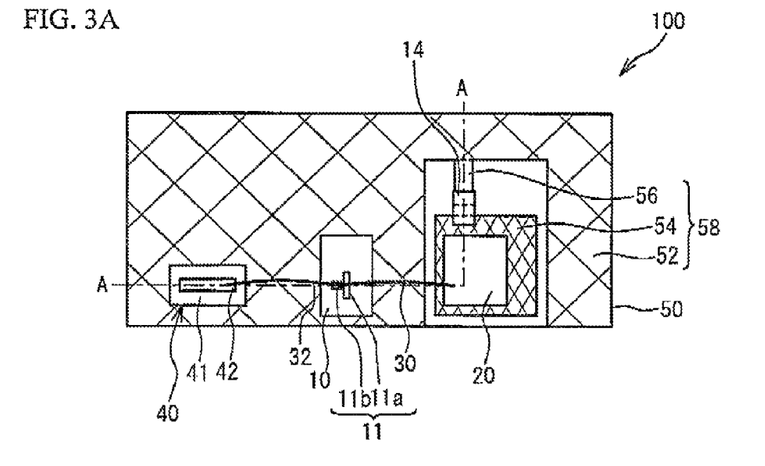
FIG. 3A illustrates a top view of an optical modulation device in accordance with a first embodiment.
Figure 3B:
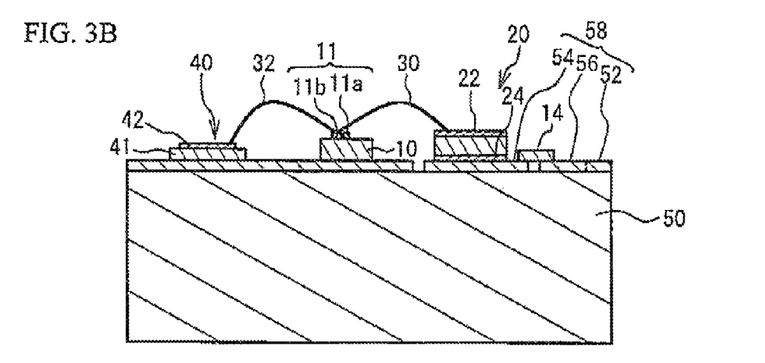
FIG. 3B illustrates a schematic cross sectional view taken along a line A-A of FIG. 3A.

A description will be given of a first embodiment achieving stable characteristics of an optical modulation device. FIG. 3A illustrates a top view of an optical modulation device 100 in accordance with the first embodiment. FIG. 3B illustrates a schematic cross sectional view taken along a line A-A of FIG. 3A. As illustrated in FIG. 3A and FIG. 3B, in the optical modulation device 100, the metal layer 58 includes a metal layer 56 in addition to the metal layers 52 and 54, being different from FIG. 1A and FIG. 1B of the comparative example. A first end of the metal layer 56 provided on the upper face of the dielectric substrate 50 is coupled to the metal layer 52. A second end of the metal layer 56 is coupled to the resistor element 14. The second end of the bonding wire 30 is jointed to a region of the electrode 22 on the upper face of the chip capacitor 20 near the optical modulator 10. The other structure is the same as that of FIG. 1A and FIG. 1B. Therefore, the explanation of the other structure is omitted.

Figure 4:
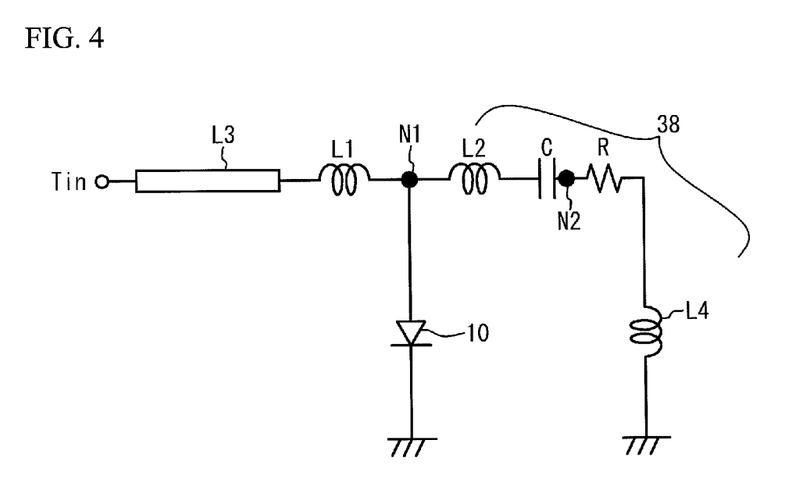
FIG. 4 illustrates a circuit diagram of the optical modulation device in accordance with the first embodiment.

FIG. 4 illustrates a circuit diagram of the optical modulation device 100 in accordance with the first embodiment. As illustrated in FIG. 4, the impedance-matching circuit 38 has an inductor L4 in addition to the inductor L2, the capacitor C and the resistor R. A series connection of the capacitor C and the resistor R is an RC circuit. The inductor L4 is coupled between the RC circuit and the ground. The inductor L4 corresponds to the metal layer 56. The metal layer 52 has a width larger than that of the inductor L4. The inductor L4 acts as a delay element between the RC circuit and the ground. The other structure is the same as that of FIG. 2 of the comparative example. Therefore, the explanation of the other structure is omitted.

In accordance with the first embodiment, as illustrated in FIG. 3A through FIG. 4, the first end of the bonding wire 30 (a first bonding wire) is electrically coupled to the optical modulator 10, and the second end of the bonding wire 30 is electrically coupled to the metal layer 56. The metal layer 56 is provided on the dielectric substrate 50 acting as an insulating layer and has an inductor component. The metal layer 52 has a ground pattern that is electrically coupled to the metal layer 56 in series. Thus, the metal layer 56 corresponding to the inductor L4 is provided, and a desirable inductance component can be generated with use of the inductor L4. It is therefore possible to minimize the inductance component of the inductor L2. That is, the length of the bonding wire 30 can be minimized. Thus, the length variability of the bonding wire 30 can be reduced. And, the variability of the inductance component of the inductor L2 can be reduced.

The resistor R is electrically coupled between the second end of the bonding wire 30 and the metal layer 52 in series. Thus, the impedance-matching circuit 38 is capable of matching the resistance component in addition to the reactance component.

The second end of the bonding wire 30 is jointed to a region of the electrode 22 on the upper face of the chip capacitor 20 near the optical modulator 10. For example, the second end of the bonding wire 30 is coupled to a region of the electrode 22 on the upper face of the chip capacitor 20 that is closer to the optical modulator 10 than a center of the electrode 22. Thus, the length of the bonding wire 30 can be reduced more. Therefore, the length variability of the bonding wire 30 can be reduced more. And, the variability of the inductance component of the inductor L2 can be reduced more.

It is preferable that the length of the bonding wire 30 is 1.5 mm or less. It is more preferable that the length of the bonding wire 30 is 0.7 mm or less. It is preferable that the length of the bonding wire 32 is small in view of restraining of the variability of the inductance component.

In the optical modulation device 100 in accordance with the first embodiment, the bonding wire 30 may be directly connected to the resistor R without the capacitor C. However, it is preferable that the capacitor C is electrically coupled between the second end of the bonding wire 30 and the metal layer 52 in series in order to cut a direct-current component. In this case, consumption current is restrained because a direct current does not flow into the resistor R. The capacitor C has only to be coupled between the second end of the bonding wire 30 and the metal layer 52 via the resistor R in series.

Second Embodiment

Figure 5A:
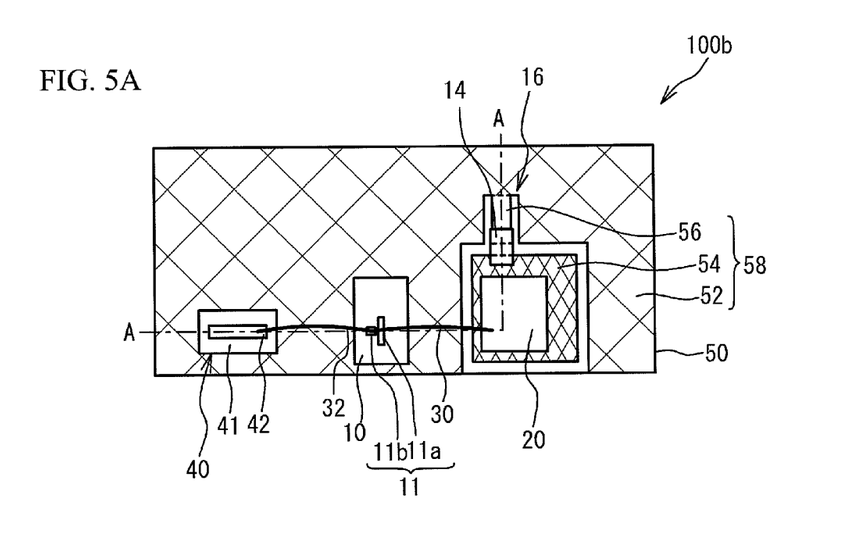
FIG. 5A illustrates a top view of an optical modulation device in accordance with a second embodiment.
Figure 5B:
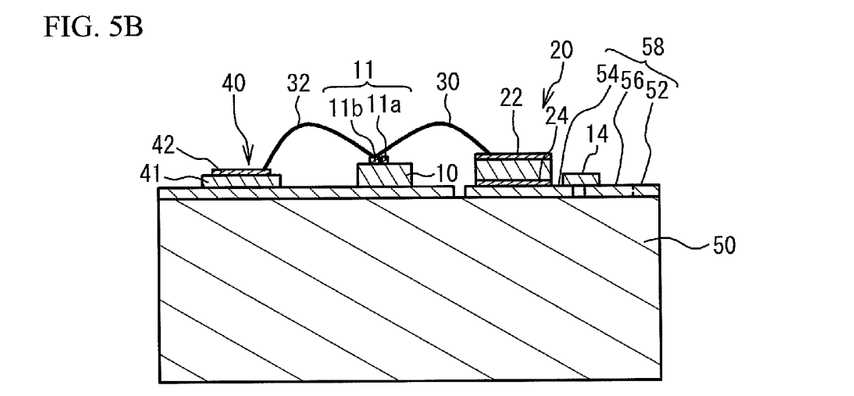
FIG. 5B illustrates a schematic cross sectional view taken along a line A-A of FIG. 5A.

A description will be given of a second embodiment. FIG. 5A illustrates a top view of an optical modulation device 100b in accordance with the second embodiment. FIG. 5B illustrates a schematic cross sectional view taken along a line A-A of FIG. 5A. As illustrated in FIG. 5A and FIG. 5B, in the optical modulation device 100b, the metal layer 52 is provided at both sides of the metal layer 56, being different from FIG. 3A and FIG. 3B of the first embodiment. The metal layer 56 and the metal layer 52 form a coplanar line as a distributed line 16. The bonding wire 30 is shorter than that of the comparative example. The thickness of the optical modulator 10 is, for example, 0.1 mm. The thickness of the chip capacitor 20 is, for example, 0.3 to 0.4 mm. The length of the bonding wire 30 is, for example, 0.5 to 1.5 mm. The diameter of the bonding wire 30 is, for example, 25 μm. The other structure is the same as that of FIG. 3A and FIG. 3B. Therefore, the explanation of the other structure is omitted.

Figure 6:
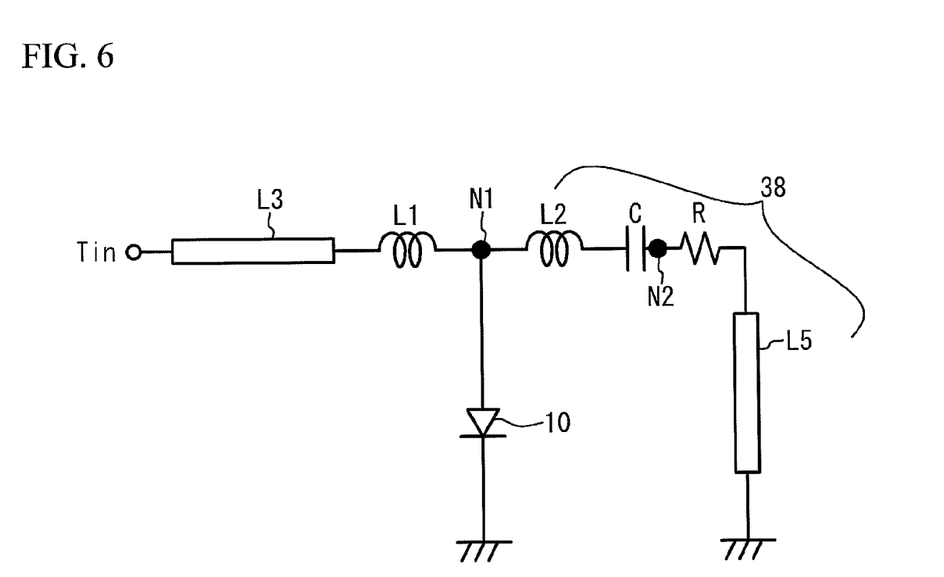
FIG. 6 illustrates a circuit diagram of the optical modulation device in accordance with the second embodiment.

FIG. 6 illustrates a circuit diagram of the optical modulation device 100b in accordance with the second embodiment. As illustrated in FIG. 6, the impedance-matching circuit 38 has a distributed line L5 (corresponding to the distributed line 16) in addition to the inductor L2, the capacitor C and the resistor R. The distributed line L5 acts as a delay element between the RC circuit and the ground. The other structure is the same as that of FIG. 4. Therefore, the explanation of the other structure is omitted.

In accordance with the second embodiment, as illustrated in FIG. 5A through FIG. 6, the first end of the bonding wire 30 (a first bonding wire) is jointed to the electrode 11 of the optical modulator 10. The resistor R (the resistor element 14) is coupled between the second end of the bonding wire 30 and the ground. The distributed line L5 (corresponding to a first distributed line) is coupled to the resistor R in series. When the metal layer 56 and the metal layer 52 form the distributed line L5, a desirable inductance component can be generated with use of the distributed line L5. For example, the distributed line L5 is capable of generating a desirable inductance component when the characteristic impedance and the length of the distributed line L5 are 40Ω and 0.3 mm. Thus, the inductance component of the inductor L2 can be minimized. That is, the length of the bonding wire 30 can be minimized. Therefore, the length variability of the bonding wire 30 can be reduced. And, the variability of the inductance component of the inductor L2 can be reduced. In this case, the metal layer 52 and the metal layer 56 form the distributed line L5 on the upper face of the dielectric substrate 50. Therefore, the variability of the distributed line L5 is small. It is preferable that the length of the bonding wire 30 is 1.5 mm or less. It is more preferable that the length of the bonding wire 30 is 0.7 mm or less. It is preferable that the length of the bonding wire 32 is small in view of restraining of the variability of the inductance component. Thus, the optical modulation device 100b is capable of achieving the stable characteristics.

In the optical modulation device 100b in accordance with the second embodiment, the bonding wire 30 may be directly connected to the resistor R without the capacitor C. However, it is preferable that the capacitor C is electrically coupled between the bonding wire 30 and the resistor R in series in order to cut a direct-current component. In this case, consumption current is suppressed because a direct current does not flow into the resistor R.

The distributed line L5 may be provided between the resistor R and the inductor L2. However, it is preferable that the distributed line L5 is coupled between the resistor R and the ground. When the distributed line L5 is inserted between the resistor R and the ground, the influence on the frequency characteristics gets smaller. This is because the influence on the frequency characteristics gets smaller when the distributed line L5 is directly connected to the ground, because the impedance of the ground is 0Ω with respect to the all frequency bands. On the other hand, when the distributed line L5 is inserted between the resistor R and the bonding wire 30, the fluctuation amount of the impedance gets larger. This is because the frequency characteristics fluctuate because of the reactance component such as a parasitic capacitance with respect to the resistor R, and the influence on the frequency characteristics gets larger according to frequency bands. Thus, the fluctuation amount of the frequency characteristics gets smaller because an edge of the distributed line L5 is directly connected to the ground in the second embodiment.

The distributed line 40 (a second distributed line) transmits an input signal to the electrode 11. Thus, loss of the input signal is suppressed. The characteristic impedance of the distributed line 40 is, for example, 50Ω. It is preferable that the characteristic impedance of the distributed line 40 is the same as the resistor R of the impedance-matching circuit 38. It is preferable that the characteristic impedance of the distributed line 40 is set to be desirable impedance.

As described above, the coplanar line is described as the distributed line 16. In this case, the lower face of the dielectric substrate 50 is under a floating condition. When the electrical potential of the lower face of the dielectric substrate 50 is constant, the characteristic impedance of the distributed line 16 is set in view of the lower face of the dielectric substrate 50. For example, a desirable inductance component may be generated according to the length of the metal layer 56 and the characteristic impedance determined by the width of the metal layer 56 or an interval between the metal layer 56 and the metal layer 52.

Third Embodiment

Figure 7A:
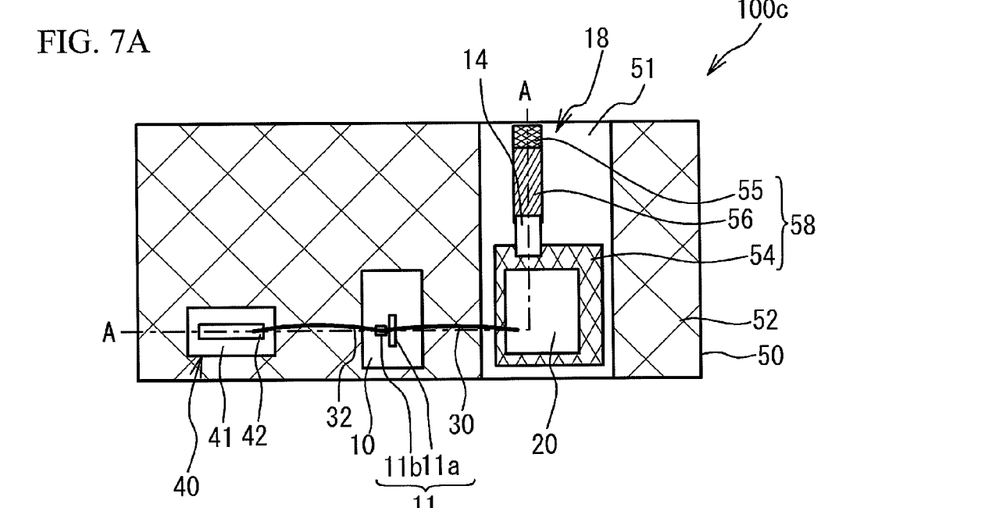
FIG. 7A illustrates a top view of an optical modulation device in accordance with a third embodiment.
Figure 7B:
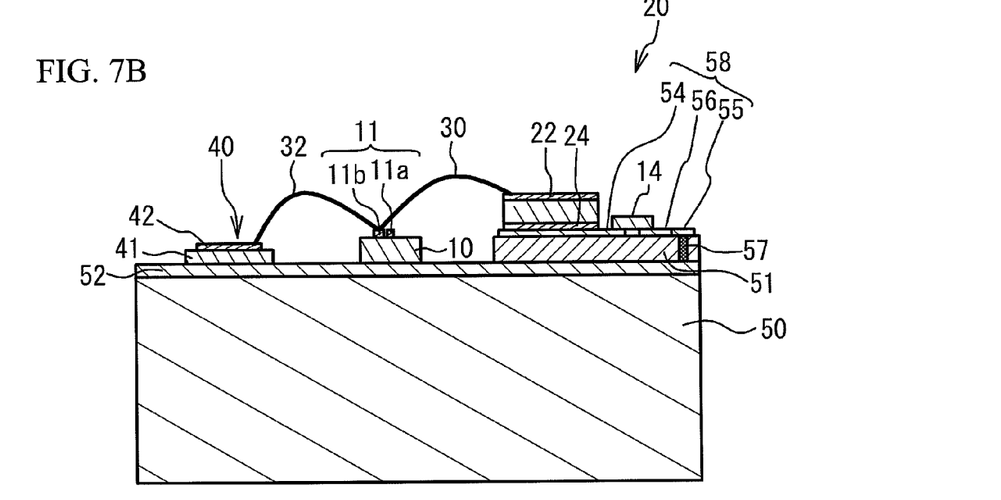
FIG. 7B illustrates a schematic cross sectional view taken along a line A-A of FIG. 7A.

A description will be given of a third embodiment. FIG. 7A illustrates a top view of an optical modulation device 100c in accordance with the third embodiment. FIG. 7B illustrates a schematic cross sectional view taken along a line A-A of FIG. 7A. As illustrated in FIG. 7A and FIG. 7B, in the optical modulation device 100c, a distributed line 18 is provided instead of the distributed line 16, being different from FIG. 4A and FIG. 4B of the second embodiment. The distributed line 18 is capable of generating a desirable inductance component as well as the distributed line 16. Therefore, the distributed line L5 is capable of generating the desirable inductance component. Accordingly, the inductance component of the inductor L2 can be minimized.

The metal layer 52 is provided on the whole of the upper face of the dielectric substrate 50. A dielectric substrate 51 is provided on the upper face of the metal layer 52 as an insulating layer. The metal layer 54, the metal layer 56 and a metal layer 55 are provided on the upper face of the dielectric substrate 51 as the metal layer 58. A via hole 57 is formed so as to penetrate the dielectric substrate 51 and electrically couple the metal layer 55 and the metal layer 52. The dielectric substrate 51 is composed of aluminum oxide, ceramics or the like. The metal layer 58 is composed of Au, Cu or the like.

The chip capacitor 20 and the resistor element 14 are provide on the upper face of the dielectric substrate 51. The chip capacitor 20 is provided on the metal layer 54. The dielectric substrate 51 mounted on the upper face of the metal layer 52 and the metal layer 56 provided on the dielectric substrate 51 form a micro strip line as the distributed line 18. A first end of the resistor element 14 is electrically coupled to the metal layer 56. A second end of the resistor element 14 is electrically coupled to the metal layer 52. A first end of the metal layer 56 is coupled to the resistor element 14. A second end of the metal layer 56 is coupled to the metal layer 52 via the metal layer 55 and the via hole 57. The other structure is the same as that of FIG. 5A and FIG. 5B of the second embodiment. Therefore, the explanation of the other structure is omitted. In the third embodiment, an edge of the distributed line L5 is grounded via the metal layer 55 and the via hole 57. Therefore, the fluctuation amount of the frequency characteristics is reduced. For example, a desirable inductance component may be generated according to the length of the metal layer 56 and the characteristic impedance determined by the width of the metal layer 56 or the thickness of the dielectric substrate 51.

Fourth Embodiment

Figure 8A:
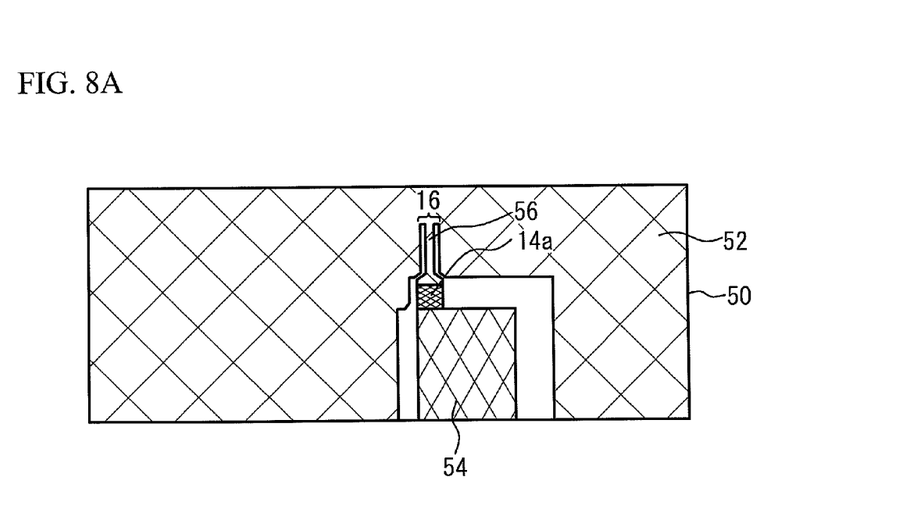
FIG. 8A illustrates a top view of a dielectric substrate in accordance with a fourth embodiment.
Figure 8B:
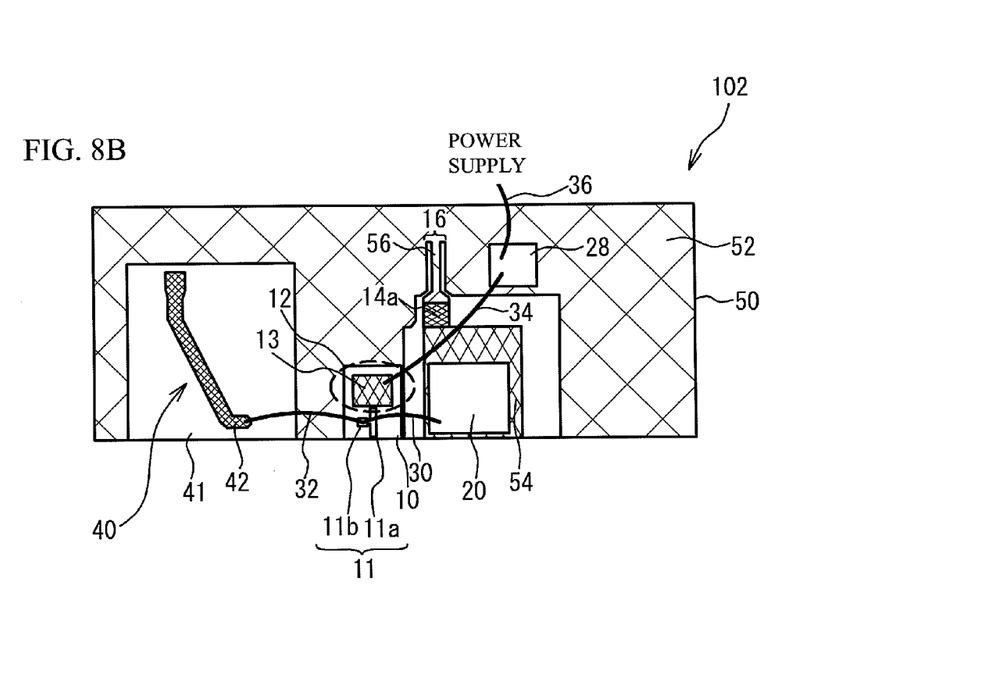
FIG. 8B illustrates a top view of an optical modulation device in accordance with the fourth embodiment.

FIG. 8A illustrates a top view of a dielectric substrate in accordance with a fourth embodiment. FIG. 8B illustrates a top view of an optical modulation device 102 in accordance with the fourth embodiment. As illustrated in FIG. 8A, in the optical modulation device 102, the metal layer 52, the metal layer 54 and the metal layer 56 are provided on the dielectric substrate 50. A thin film resistor 14a composed of tantalum nitride (TaN) or the like is provided between the metal layer 54 and the metal layer 56. The resistance value of the thin film resistor 14a is, for example, 50Ω. The metal layer 56 and the metal layer 52 provided separately from the metal layer 56 form the distributed line 16. For example, the desirable inductance component of the distributed line L5 can be generated by changing the width of the metal layer 56. In the fourth embodiment, the width of the metal layer 56 is smaller than that of a side of the thin film resistor 14a. A taper-shaped region of which width gets smaller from the side of the thin film resistor 14a to the side of the metal layer 52 is formed in a region of the metal layer 56 connected to the thin film resistor 14a. Thus, signal reflection at the connection portion between the thin film resistor 14a and the metal layer 56 is suppressed.

As illustrated in FIG. 8B, the distributed line 40, the optical modulator 10 and the chip capacitor 20 are provided on the metal layer 52. The optical modulator 10 and a semiconductor laser 12 are provided on an identical chip. An electrode 13 for supplying a driving current to the semiconductor laser 12 is provided on the semiconductor laser 12. The chip capacitor 20 is provided on the metal layer 54. The capacitance of the chip capacitor 20 is, for example, 100 nF. The bonding wire 32 electrically couples the electrode 11 and an edge of the wiring pattern 42 of the distributed line 40. The bonding wire 30 electrically couples the electrode 11 and the upper face of the chip capacitor 20. A bonding wire 34 couples the electrode 13 on the upper face of the semiconductor laser 12 and an upper face of a chip capacitor 28. A bonding wire 36 is coupled to the upper face of the chip capacitor 28 and is coupled to a power supply for driving the semiconductor laser 12. The chip capacitor 28 is a capacitor for removing noise. A lower face of the chip capacitor 28 is grounded via the metal layer 52. The capacitance of the chip capacitor 28 is, for example, 100 pF. The thin film resistor 14a may be a chip capacitor. In the fourth embodiment, the width of the metal layer 56 is smaller than that of a side of the capacitor. A taper-shaped region of which width gets smaller from the side of the capacitor to the side of the metal layer 52 is formed in a region of the metal layer 56 connected to the capacitor. Thus, signal reflection at the connection portion between the capacitor and the metal layer 56 is suppressed.

The semiconductor laser 12 emits a laser light when a current is provided to the semiconductor laser 12 via the bonding wire 34. For example, a direct current from the electrode 13 to the metal layer 52 is provided to the semiconductor laser 12. Because the direct current is provided to the semiconductor laser 12, an emitted light from the semiconductor laser 12 is not modulated. When a high frequency signal is input to the electrode 11 of the optical modulator 10 via the distributed line 40, the emitted light from the semiconductor laser 12 is modulated.

Figure 9:
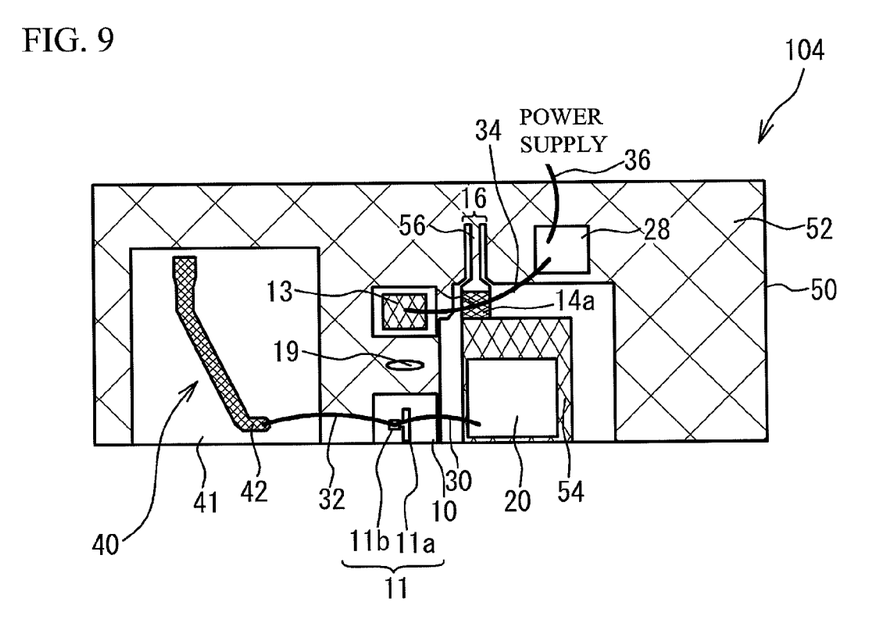
FIG. 9 illustrates a top view of an optical modulation device in accordance with a modified embodiment of the fourth embodiment.

FIG. 9 illustrates a top view of an optical modulation device 104 in accordance with a modified embodiment of the fourth embodiment. As illustrated in FIG. 9, in the optical modulation device 104, the semiconductor laser 12 and the optical modulator 10 are separately provided on chips. A lens 19 is provided so as to optically couple the semiconductor laser 12 and the optical modulator 10. The other structure is the same as that of FIG. 8B of the fourth embodiment. Therefore, the explanation of the other structure is omitted.

The optical modulator 10 and the semiconductor laser 12 may be mounted on an identical chip as well as the fourth embodiment. The optical modulator 10 and the semiconductor laser 12 may be separately mounted on chips as well as the modified embodiment.

In the first through fourth embodiments and the modified embodiment, the EA modulator is described as the optical modulator 10. However, a Mach-Zehnder optical modulator, a LN (Lithium Niobate) optical modulator or the like may be used as the optical modulator 10.

Fifth Embodiment

Figure 10A:
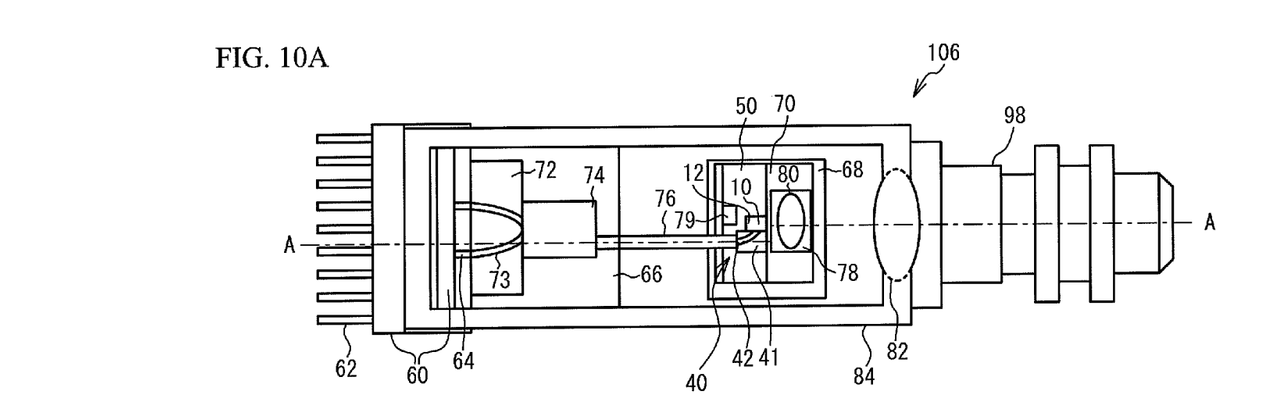
FIG. 10A illustrates a top view of an optical module in accordance with a fifth embodiment of which cap is detached.
Figure 10B:
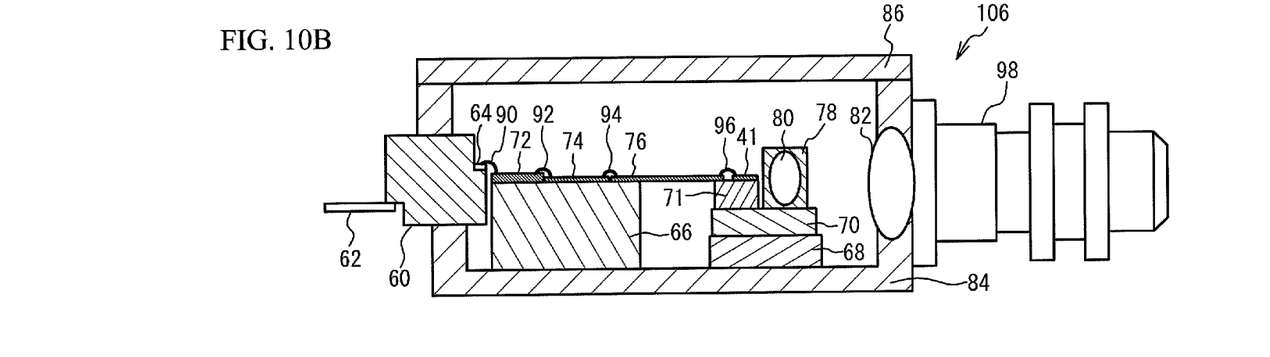
FIG. 10B illustrates a cross sectional view taken along a line A-A of FIG. 10A.

A fifth embodiment is an example of an optical module including at least one of the optical modulation devices of the first through fourth embodiments and the modified embodiment. FIG. 10A illustrates a top view of an optical module 106 in accordance with the fifth embodiment of which cap is detached. FIG. 10B illustrates a cross sectional view taken along a line A-A of FIG. 10A. In FIG. 10B, a side view of a receptacle 98 is illustrated. As illustrated in FIG. 10A and FIG. 10B, the optical module 106 has a structure in which the optical modulator 10, the semiconductor laser 12, a laser-driving IC (Integrated Circuit) 74 and so on are housed in a chassis 84.

A temperature control portion such as a TEC (Thermoelectric Cooler) 68 is provided on a bottom face of the chassis 84 composed of a metal or the like. A carrier 70 composed of an insulating material such as aluminum oxide, ceramics or the line and having a high thermal conductivity is provided on the TEC 68. A sub carrier 71 and a lens holder 78 are mounted on the carrier 70.

The sub carrier 71 acts as the dielectric substrate 50 of the optical modulation device of the first through fourth embodiments and the modified embodiment. A chip that integrally includes the dielectric substrate 41, the optical modulator 10 and the semiconductor laser 12, and a photo detector 79 are provided on the sub carrier 71. The lens holder 78 holds a lens 80. The wiring pattern 42 is provided on the upper face of the dielectric substrate 41. The wiring pattern 42 and the metal layer (not illustrated) on which the dielectric substrate 41 is provided form the distributed line 40.

A heat sink 66 composed of a metal such as copper tungsten (CuW) or copper molybdenum (CuMo) is provided on the bottom face of the chassis 84. The laser-driving IC 74 and a substrate 72 having a transmission line 73 are provided on the heat sink 66. The level of the upper face of the heat sink 66 is approximately equal to the level of the upper face of the sub carrier 71. A bridge 76 having a transmission line is provided between the upper face of the heat sink 66 and the upper face of the sub carrier 71.

A front wall of the chassis 84 holds a lens 82. The receptacle 98 is fixed to the front face of the chassis 84. A feed through 60 composed of an insulating material is buried in a back wall of the chassis 84. In the feed through 60, a wiring that electrically couples a terminal 64 in the chassis 84 and a terminal 62 out of the chassis 84 is provided.

A bonding wire 90 electrically couples the terminal 64 and the transmission line 73 of the substrate 72. A bonding wire 92 electrically couples the transmission line 73 and the laser-driving IC 74. A bonding wire 94 electrically couples the laser-driving IC 74 and the bridge 76. A bonding wire 96 electrically couples the bridge 76 and the distributed line 40. Details of the optical modulation device are the same as those of the first through fourth embodiments and the modified embodiment. Therefore, the explanation of the details is omitted.

An input signal of high frequency is input to the laser-driving IC 74 via a wiring in the feed through 60, the terminal 64, the bonding wire 90, the transmission line 73 and the bonding wire 92 from the terminal 62. The laser-driving IC 74 amplifies the input signal and outputs the amplified signal. The output signal is input to the distributed line 40 via the bonding wire 94, the bridge 76 and the bonding wire 96. After that, the input signal is input to the electrode of the optical modulator 10 as well as the first through fourth embodiments and the modified embodiment. The optical modulator 10 modulates the intensity of an output signal of the semiconductor laser 12 and emits the modulated signal. The lens 80 and the lens 82 optically couple the optical modulator 10 and a fiver edge in the receptacle 98. Thus, the light emitted by the optical modulator 10 is introduced into a fiver. The photo detector 79 detects intensity of a light emitted from a back face of the semiconductor laser 12. A control circuit (not illustrated) feed-back controls a current applied to the semiconductor laser 12 according to an output of the photo detector 79. The TEC 68 keeps the temperature of the semiconductor laser 12 and the optical modulator 10 constant. Thus, a wavelength of the light emitted by the optical modulator 10 can be locked.

In the fifth embodiment, the optical modulation device of the first through fifth embodiments and the modified embodiment is used in the optical module 106. In the fifth embodiment, a description is given of the optical module housing the laser-driving IC 74. However, the laser-driving IC 74 may be out of the optical module.

In the above embodiments, the metal layer 56 acts as a first metal layer. The metal layer 52 acts as a second metal layer. The metal layer 54 acts as a third metal layer.

The present invention is not limited to the specifically disclosed embodiments and variations but may include other embodiments and variations without departing from the scope of the present invention.

What is claimed is:

1. An optical modulation device comprising:
   an optical modulator;
   an insulating layer;
   an RC circuit including a resistor and a capacitor connected in series;
   a bonding wire connected between the optical modulator and the RC circuit;
   a first metal layer provided on the insulating layer; and
   a second metal layer that has a width larger than that of the first metal layer and is provided on the insulating layer, the second metal layer being connected with a ground potential and being connected to the RC circuit via the first metal layer.

2. The optical modulation device as claimed in claim 1, wherein the bonding wire has a length of 1.5 mm or less.

3. The optical modulation device as claimed in claim 1, wherein the bonding wire is connected between the optical modulator and a region of an electrode on an upper face of the capacitor that is closer to the optical modulator than a center of the electrode.

4. The optical modulation device as claimed in claim 1, wherein the first metal layer and the second metal layer are coupled to each other via a via hole penetrating the insulating layer.

5. The optical modulation device as claimed in claim 1, wherein the optical modulator is integrated with a semiconductor laser.

6. The optical modulation device as claimed in claim 1 further comprising:
   a transmission line that is composed of a distributed line and receives an input signal; and
   a connecting element connected between the transmission line and the optical modulator, the connecting element being comprised by a bonding wire.

7. The optical modulation device as claimed in claim 1 wherein the first metal layer has a first region and a second region having a different width.

8. The optical modulation device as claimed in claim 7 wherein the first metal layer has a region of a taper shape connecting the first region and the second region.

9. The optical modulation device as claimed in claim 1, wherein the first metal layer has a first region having a first width and a second region having a second width and adjacent to the resistor,
   the first width being smaller than the second width.

10. The optical modulation device as claimed in claim 9, wherein the first metal layer has a region of a taper shape connecting the first region and the second region.

11. The optical modulation device as claimed in claim 1, wherein the first metal layer has a first region having a first width and a second region having a second width and adjacent to the capacitor,
    the first width being smaller than the second width.

12. The optical modulation device as claimed in claim 11, wherein the first metal layer has a region of a taper shape connecting the first region and the second region.

13. The optical modulation device as claimed in claim 1, wherein the first metal layer is a distributed line.

14. The optical modulation device as claimed in claim 13, wherein the distributed line is a coplanar line or a micro strip line.

15. The optical modulation device as claimed in claim 14, wherein:
    the coplanar line is structured with the first metal layer and the second metal layer on the insulating layer; and
    the inductor component is determined by a length of the first metal layer and characteristic impedance determined by a distance between the first metal layer and the second metal layer or a width of the first metal layer.

16. The optical modulation device as claimed in claim 14, wherein:
    the micro strip line is structured with the first metal layer on an insulating layer and a metal layer that is provided under the insulating layer, and has a ground potential; and
    the inductor component is determined by a length of the first metal layer and characteristic impedance determined by a thickness of the insulating layer or a width of the first metal layer.

* * * * *